United States Patent
Zhang

(10) Patent No.: US 11,335,474 B2
(45) Date of Patent: May 17, 2022

(54) DISPLAY SUBSTRATE HAVING TRANSPARENT ELECTRODE AND MANUFACTURING METHOD THEREOF

(71) Applicant: TCL CHINA STAR OPTOELECTRONICS TECHNOLOGY CO., LTD., Shenzhen (CN)

(72) Inventor: Yu Zhang, Shenzhen (CN)

(*) Notice: Subject to any disclaimer, the term of this patent is extended or adjusted under 35 U.S.C. 154(b) by 307 days.

(21) Appl. No.: 16/619,474

(22) PCT Filed: Nov. 12, 2019

(86) PCT No.: PCT/CN2019/117505
§ 371 (c)(1),
(2) Date: Dec. 5, 2019

(87) PCT Pub. No.: WO2021/072857
PCT Pub. Date: Apr. 22, 2021

(65) Prior Publication Data
US 2021/0358653 A1    Nov. 18, 2021

(30) Foreign Application Priority Data

Oct. 15, 2019   (CN) .......................... 201910976234.2

(51) Int. Cl.
*H05K 1/03* (2006.01)
*H01B 1/24* (2006.01)
*C01B 32/921* (2017.01)
*H05K 1/02* (2006.01)
*H05K 1/09* (2006.01)
(Continued)

(52) U.S. Cl.
CPC ............. *H01B 1/24* (2013.01); *C01B 32/921* (2017.08); *H05K 1/0274* (2013.01); *H05K 1/09* (2013.01); *H05K 3/107* (2013.01); *C01P 2004/20* (2013.01); *H01L 51/0097* (2013.01); *H01L 51/5206* (2013.01); *H05K 1/034* (2013.01); *H05K 1/0346* (2013.01); *H05K 1/0393* (2013.01); *H05K 2201/015* (2013.01);
(Continued)

(58) Field of Classification Search
CPC ...................................... H05K 1/0313–1/0373
See application file for complete search history.

(56) References Cited

U.S. PATENT DOCUMENTS

2016/0336088 A1   11/2016   Barsoum et al.
2017/0294546 A1   10/2017   Ghidiu et al.

FOREIGN PATENT DOCUMENTS

CN   101523247 A   9/2009
CN   106075040 A   5/2018
(Continued)

OTHER PUBLICATIONS

Machine translation of CN 109827945 A (Year: 2019).*

*Primary Examiner* — Jeremy C Norris

(57) ABSTRACT

A display substrate having a transparent electrode and manufacturing method thereof includes a transparent substrate, and a patterned channel is disposed on the transparent substrate; a transparent electrode including a composite material of MXene material and polyvinylpyrrolidone, and the transparent electrode is filled in the patterned channel. The transparent electrode of embodiments of the present disclosure has advantages of high transmittance, high conductivity, great machinability, great substrate affinity, great ductility, etc.

19 Claims, 2 Drawing Sheets

(51) Int. Cl.
  *H05K 3/10* (2006.01)
  *H01L 51/00* (2006.01)
  *H01L 51/52* (2006.01)
(52) U.S. Cl.
  CPC .............. *H05K 2201/0108* (2013.01); *H05K 2201/0154* (2013.01)

(56) References Cited

FOREIGN PATENT DOCUMENTS

| | | | | |
|---|---|---|---|---|
| CN | 108417713 | A | 8/2018 | |
| CN | 109012220 | A | 12/2018 | |
| CN | 109417108 | A | 3/2019 | |
| CN | 109461818 | A | 3/2019 | |
| CN | 109564892 | A | 4/2019 | |
| CN | 109827945 | A * | 5/2019 | ............ G01N 21/65 |
| CN | 109950401 | A | 6/2019 | |
| CN | 110176538 | A | 8/2019 | |
| JP | 6564552 | B1 | 8/2019 | |
| KR | 20180086052 | A | 7/2018 | |

* cited by examiner

DISPLAY SUBSTRATE HAVING TRANSPARENT ELECTRODE AND MANUFACTURING METHOD THEREOF

FIELD OF INVENTION

The present disclosure relates to the field of display technology, and specifically relates to a display substrate having a transparent electrode and a manufacturing method thereof.

BACKGROUND OF INVENTION

Because transparent electrodes are used in solar cells, light emitting diodes (LEDs), touch panels, sensors, etc., they have become one of research hot spots at present. Growth of the transparent electrode first aims at improving conductive performance and transmission performance of the transparent electrode to development of the transparent electrodes today, where requirements and productions increase day by day. Presently, metal electrodes (such as silver) and carbon electrodes are electrodes commonly used.

However, with increasing popularity of organic light emitting diodes (OLEDs), stretchable solar cells, stretchable displays, stretchable antennas, intelligent clothing, skin sensors, and artificial muscles day by day, transparent electrodes act as an important component of them and not only require high flexibility, but also require good tensile performance.

Different flexible electronic devices require different tensile strengths, so it is necessary to produce a transparent electrode with adjustable stretching ranges. In order to improve optoelectronic efficiency of stretchable optoelectronic devices, electrodes are necessary to satisfy high conductivity and high light transmittance at same time. In addition, adhesive ability of a conductive layer of the electrode to a substrate should be good. However, the flexible transparent electrode having all these performances does not exist.

SUMMARY OF INVENTION

An embodiment of the present disclosure provides a display substrate having a transparent electrode and a manufacturing method thereof. In this embodiment, the transparent electrode has advantages of high transmittance, high conductivity, great machinability, great substrate affinity, great ductility, etc.

In order to solve the problems mentioned above, on first aspect, the present disclosure provides a display substrate having a transparent electrode, including:

A transparent substrate, and a patterned channel is disposed on the transparent substrate.

The transparent electrode including a composite material of MXene (two-dimensional transition metal carbide, nitride or carbonitride) material and polyvinylpyrrolidone, and the transparent electrode is filled in the patterned channel.

According to several embodiments of the present disclosure, the transparent substrate is a flexible glass substrate, a perfluoroalkoxy substrate, or a flexible polyimide substrate.

According to several embodiments of the present disclosure, the MXene material is two-dimension $Ti_3C_2$ or two-dimension $Ti_2C$.

According to several embodiments of the present disclosure, a thickness of the MXene material is 2 mm.

According to several embodiments of the present disclosure, the transparent electrode has a regular graph, and the regular graph at least partially matches a pattern of the channel.

According to several embodiments of the present disclosure, the display substrate includes an insulation protection layer, and the insulation protection layer covers part or all of a surface of the transparent electrode.

On second aspect, the present disclosure provides a manufacturing method of a display substrate having a transparent electrode, including steps as follows:

A first step, providing etching liquid, adding a MAX (ternary carbides or nitrides, which is a new machinable ceramic material) phase material into the etching liquid to obtain a first suspension containing a multi-layer MXene material.

A second step, adding dimethyl sulfoxide into the first suspension to obtain an one-layer MXene material.

A third step, adding the one-layer MXene material into a polyvinylpyrrolidone solution to obtain a second suspension.

A fourth step, adding the second suspension into a patterned channel of the transparent substrate, and by heating and curing to form a transparent electrode.

According to several embodiments of the present disclosure, the first step includes adding the MAX phase material into the etching liquid to stir, and then performing scrubbing on the MAX phase material after etching.

According to several embodiments of the present disclosure, a stirring temperature of the etching liquid ranges from 20° C. to 80° C., and a stirring time ranges from 6 hours to 20 hours.

According to several embodiments of the present disclosure, the scrubbing is that the MAX phase material after etching is scrubbed by deoxidized deionized water until a pH value ranges from 6 to 7.

According to several embodiments of the present disclosure, the transparent substrate is a flexible glass substrate, a perfluoroalkoxy substrate, or a flexible polyimide substrate.

According to several embodiments of the present disclosure, the MAX phase material is a combination of one or several of titanium silicon carbide, titanium aluminum carbide, titanium aluminum nitride, titanium carbonitride, and aluminum titanium carbonitride.

According to several embodiments of the present disclosure, the etching liquid is an aqueous solution of hydrofluoric acid, an aqueous solution of ammonium hydrogen fluoride, or a mixing solution formed by hydrofluoric acid and one or several of hydrochloric acid, sulphuric acid, or villiaumite.

According to several embodiments of the present disclosure, the second step includes peeling one layer of the multi-layer MXene material and scrubbing the multi-layer MXene material.

According to several embodiments of the present disclosure, the second step includes performing an ultrasound process and a centrifugal process on the multi-layer MXene material.

According to several embodiments of the present disclosure, the one-layer MXene material is two-dimension $Ti_3C_2$ or two-dimension $Ti_2C$.

According to several embodiments of the present disclosure, a thickness of the one-layer MXene material is 2 mm.

According to several embodiments of the present disclosure, the channel in the fourth step is manufactured by a photolithography method or a template occupying method.

According to several embodiments of the present disclosure, the transparent electrode has a regular graph, and the regular graph at least partially matches a pattern of the channel.

The embodiments of the present disclosure manufacture the display substrate having the transparent electrode by adopting the composite material of the MXene material and the polyvinylpyrrolidone. Because the MXene material has a special two-dimensional lamella structure, ultimate strong machinability, ultimate high conductivity, rapid electron transmission speed, and many other excellent characteristics, thereby the transparent electrode of the embodiments also having advantages of high transmittance, high conductivity, great machinability, great substrate affinity, great ductility, etc, which can support high frequency display, such as a design requirement of a 240 Hz high specification display device and the like, and meet design requirements of display devices, such as transparent flexible organic light emitting diode (OLED) devices, flexible wearable devices, touch panels, foldable touch panels, electronic papers.

DETAILED DESCRIPTION OF PREFERRED EMBODIMENTS

To more clearly illustrate the technical solutions of the embodiments of the present disclosure, the accompanying figures of the present disclosure will be described in brief. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
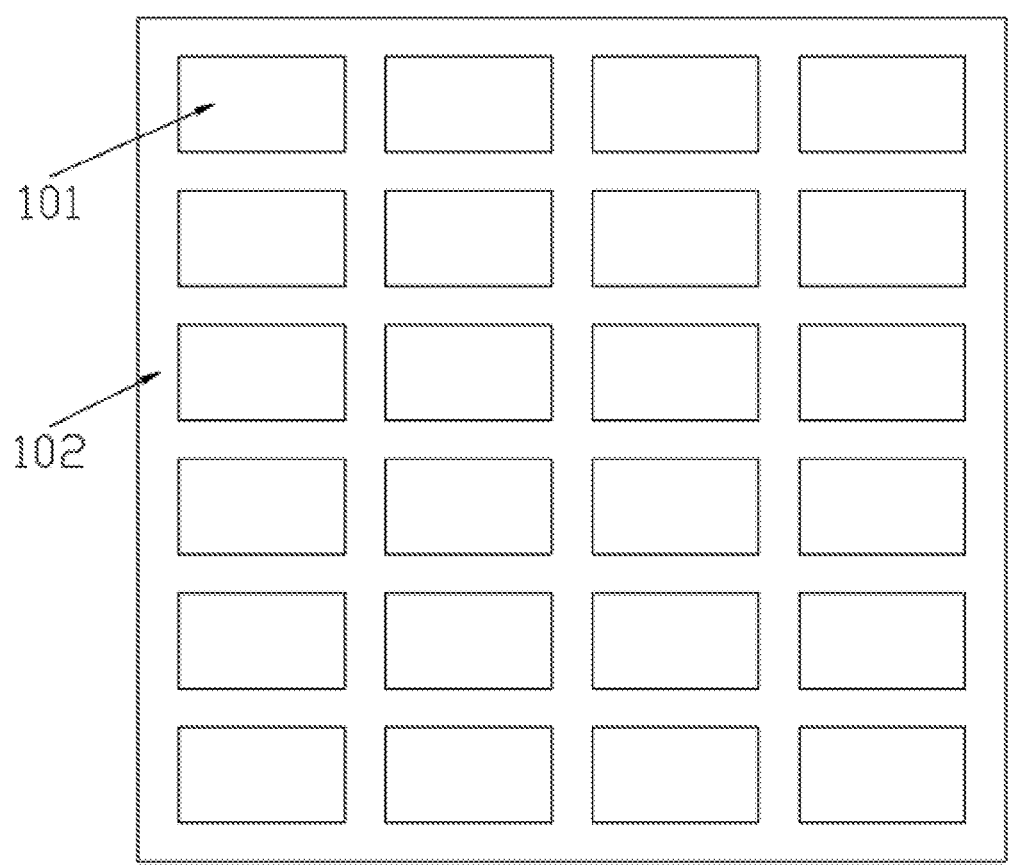
FIG. 1 is a structural schematic diagram of one embodiment of a display substrate of embodiments of the present disclosure.

The technical solutions in the embodiments of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

In the description of the present disclosure, it is to be understood that the orientation or positional relationship indicated by the terms "center", "longitudinal", "transverse", "length", "width", "thickness", "upper", "lower", "front", "rear", "left", "right", "vertical", "horizontal", "top", "bottom", "inside", "outside", etc. is based on the orientation or positional relationship shown in the accompanying figures, which is merely for the convenience for describing of the present disclosure and for the simplification of the description, and is not intended to indicate or imply that the indicated devices or elements have a specific orientation or is constructed and operated in a specific orientation. Therefore, it should not be understood as a limitation on the present disclosure. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, the meaning of "a plurality" is two or more unless clearly and specifically defined otherwise.

In recent years, excellent optical properties and excellent electrical properties of many two-dimensional materials which includes graphene, phosphorene, carbon nitride ($C_3N_4$) are dug out. A new developed two-dimensional material has a high penetration rate (>85%) in an ultraviolet range and a visible light range and has a low sheet resistance in a range of 0.01 $k\Omega sq^{-1}$ to 1 $k\Omega sq^{-1}$. The material is applied in aspects of supercapacitors, lithium-ion and other type batteries, fuel cells, sensors, etc. However, researches of applying MXene materials in flexible transparent displays are still less.

Based on this, the present disclosure provides a display substrate having a transparent electrode and a manufacturing method thereof. The details are described below respectively.

First, an embodiment of the present disclosure provides a display substrate having a transparent electrode. The display substrate includes: a transparent substrate, and a patterned channel is disposed on the transparent substrate; a transparent electrode including a composite material of MXene material and polyvinylpyrrolidone, and the transparent electrode is filled in the patterned channel.

As illustrated in FIG. 1, FIG. 1 is a structural schematic diagram of a display substrate of an embodiment of the present disclosure. The display substrate includes: a transparent substrate 101, and a patterned channel is disposed on the transparent substrate; a transparent electrode 102 including a composite material of MXene material and polyvinylpyrrolidone (PVP), and the transparent electrode 102 is filled in the patterned channel.

The embodiment of the present disclosure manufactures the display substrate having the transparent electrode by adopting the composite material of the MXene material and the polyvinylpyrrolidone. Because the MXene material has a special two-dimensional lamella structure, ultimate strong machinability, ultimate high conductivity, rapid electron transmission speed, and many other excellent characteristics, thereby the transparent electrode of the embodiments also having advantages of high transmittance, high conductivity, great machinability, great substrate affinity, great ductility, etc, which can support high frequency display, such as a design requirement of a 240 Hz high specification display device and the like, and meet design requirements of display devices, such as transparent flexible organic light emitting diode (OLED) devices, flexible wearable devices, touch panels, foldable touch panels, electronic papers.

Generally, the transparent electrode 102 has a regular graph, and the regular graph at least partially matches a pattern of the channel.

Because the display substrate having the transparent electrode is often used in a transparent flexible glass substrate organic light emitting diode (OLED) device, the transparent substrate 101 is necessary to have a good transmittance rate and flexibility. Preferably, the transparent substrate 101 of an embodiment of the present disclosure is a flexible glass substrate, a perfluoroalkoxy substrate, or a flexible polyimide (PI) substrate.

In an embodiment of the present disclosure, the MXene material has great machinability, which is conducive to applications of flexible touch screens and OLEDs. The MXene material is a two-dimensional inorganic compound in a series of newest inventions of materials science, and the theories and the experimental results prove that the MXene material has high metal conductivity, good hydrophilicity and strong mechanical properties.

It should be noted, that the MXene material is a two-dimensional transition metal carbide, nitride or carbonitride. Preferably the MXene material is the two-dimensional transition metal carbide, which has high metal conductivity, good hydrophilicity and strong mechanical properties, and more preferably, the MXene material is $Ti_3C_2$ or $Ti_2C$.

It will be understood, that the display substrate having the transparent electrode of the embodiment of the present disclosure only describes and illustrates part of the structures (part of the structures of the transparent substrate 101 and the transparent electrode 102). In addition to the above structures, the display substrate having the transparent electrode described in the embodiment of the present disclosure may further include any other necessary structure as needed, and is not limited herein. For example, in the embodiment of the present disclosure, the display substrate having the transparent electrode may further include an insulation protection layer, and the insulation protection layer covers part or all of a surface of the transparent substrate 101 and the transparent electrode 102.

Figure 2:
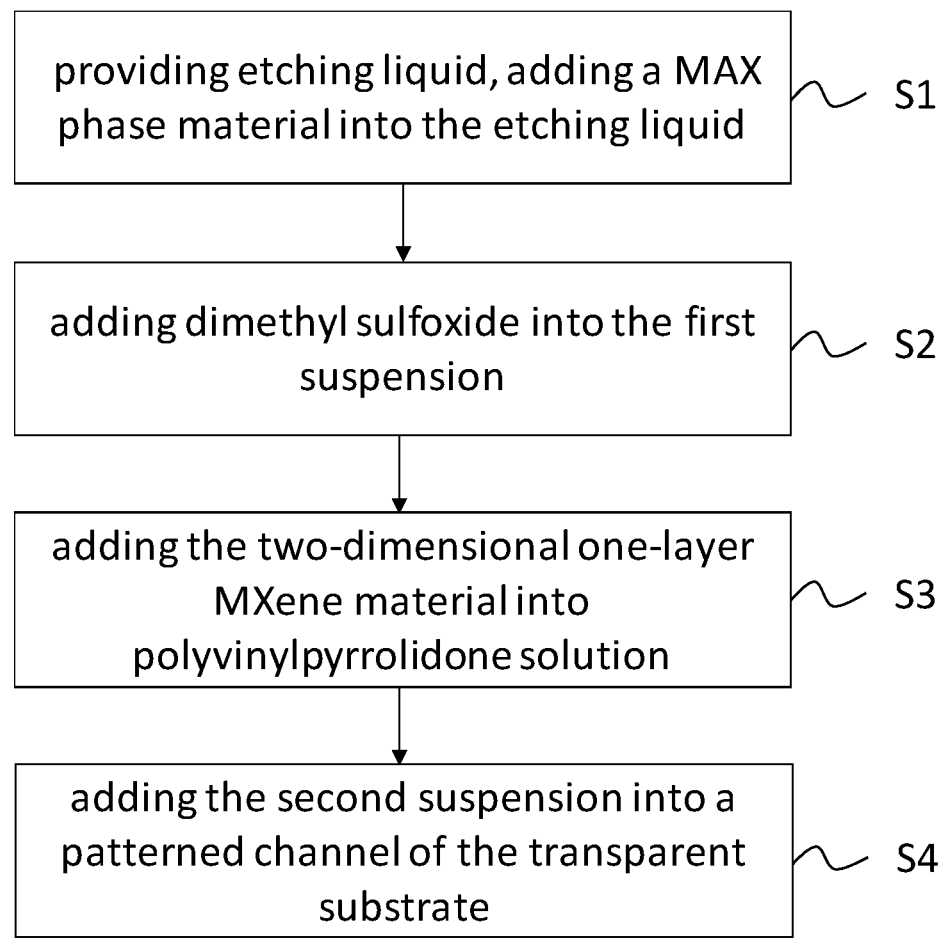
FIG. 2 is a flow chart of one embodiment of a manufacturing method of embodiments of the present disclosure.

An embodiment of the present disclosure further provides a manufacturing method of a display substrate having a transparent electrode. As illustrated in FIG. 2, FIG. 2 is a flow chart of a manufacturing method of the embodiment of the present disclosure, including steps as follows:

A first step (S1 in the figure), providing etching liquid, adding a MAX phase material into the etching liquid to obtain a first suspension containing a multi-layer MXene material.

A second step (S2 in the figure), adding dimethyl sulfoxide into the first suspension to obtain an one-layer MXene material.

A third step (S3 in the figure), adding the one-layer MXene material into polyvinylpyrrolidone solution to obtain a second suspension.

A fourth step (S4 in the figure), adding the second suspension into a patterned channel of the transparent substrate, and by heating and curing to form a transparent electrode.

In an preferred embodiment of the present disclosure, specifically, the first step further includes proving etching liquid; adding the MAX phase material into the etching liquid to stir; controlling a temperature in a range between 20° C. to 80° C. and stirring it at 6 hours to 20 hours; scrubbing the MAX phase material by deoxidized deionized water until a pH value ranges from 6 to 7 to the first suspension containing the multi-layer MXene material.

Furthermore, the MAX phase material is a new machinable ceramic material highly concerned. Because the MAX phase material has several good properties of metal materials and ceramic materials, it is also known as metal-ceramic material. This type of the material includes more than fifty types of ternary carbides or nitrides, which can use a concept of $M_{n+1}AX_n$ to indicate, wherein M is a transition metal element, A is a main group element, and X is a carbon element or a nitrogen element. Preferably, it is a combination of one or several of titanium silicon carbide ($Ti_3SiC_2$), titanium aluminum carbide ($Ti_3AlC_2$ and $Ti_2AlC$), titanium aluminum nitride (TiAlN), titanium carbonitride (TiCN), and aluminum titanium carbonitride (TiAlCN), and at this time, the MAX phase material is a layer structure stacked closely. The etching liquid is an aqueous solution of hydrofluoric acid (HF), an aqueous solution of ammonium hydrogen fluoride ($NH_4HF_2$), or a mixing solution formed by hydrofluoric acid and one or several of hydrochloric acid (HCl), sulphuric acid ($H_2SO_4$), or villiaumite (NaF). For example, corrosion of $Ti_3AlC_2$ at room temperature in the HF aqueous solution selectively removes the A atom (Al), while a surface of a carbide layer produces a terminal of O, OH and/or F atoms. After the etching is finished, the multi-layer MXene material is a two-dimensional structure similar to a shape of an accordion, and a stirring time is preferred to be 8 hours.

In a preferred embodiment of the present disclosure, specifically, the second step further includes adding dimethyl sulfoxide (($CH_3)_2SO$, DMSO) into the first suspension; peeling one layer of the multi-layer MXene material; and scrubbing the multi-layer MXene material by deionized water to obtain an one-layer MXene material.

Furthermore, adding the DMSO into the first suspension, and the DMSO performs an intercalation process, and by stirring, the process can be accelerated. After the intercalation is finished, the one-layer MXene material can be peeled off. It will be understood, that in addition by peeling off, the one-layer MXene material can be obtained by an ultrasound process and a centrifugal process. A thickness of the one-layer MXene material is 2 mm, and after it is manufactured into a device, the transmittance rate is high.

In a preferred embodiment of the present disclosure, specifically, the fourth step further includes manufacturing a patterned channel by a photolithography method or a template occupying method on a surface of the transparent substrate.

Furthermore, the patterning of the transparent electrode can further improve conductivity, improve performance of the device. The transparent electrode has a regular graph, and the regular graph at least partially matches a pattern of the channel. In this embodiment, the regular graph is rectangle grids. It should be understood, the flexible electrode may also be other arbitrary rule graphs. A thickness and uniformity of the composite material adopted by the transparent electrode can be controlled, and can be selected according to conductivity required from actual production. The transparent electrode has excellent optoelectronic performance and has good application prospect.

The embodiment of the present disclosure manufactures the display substrate having the transparent electrode by adopting the MXene material, which can fill blank spots of the MXene material in the research of the field of display devices. Meanwhile, the display substrate having the transparent electrode in the embodiment of the present disclosure has high transmittance, high electrical conductivity, and can support high-frequency display, such as design requirements of a 240 HZ high-definition display device. The display substrate of the transparent electrode has advantages of high transmittance, high conductivity, great machinability, great substrate affinity, great ductility, etc., and meet design requirements of new display devices, such as foldable touch panels and flexible wearable devices, and further is applied in solar cells, OLED displays, micro LED displays, etc.

By adopting the display device having the transparent electrode described by the embodiments mentioned above, the performance of the display device is further improved.

In the embodiments mentioned above, the descriptions to the various embodiments are emphasized, and the part is not described in detailed in an embodiment, can refer to the detailed description of other embodiments mentioned above, and will not give unnecessary details herein.

During a specific implementation, the various units or structures mentioned above may be implemented as a separate entity, or may be implemented in any combination, as the same or several entities. For the specific implementation of the various units or structures mentioned above, can refer to the method embodiments mentioned above, and will not give unnecessary details herein.

For the specific implementation of each operation can refer to the embodiments mentioned above, and will not give unnecessary details herein.

The display substrate having the transparent electrode and the manufacturing method thereof provided by the embodiments of the present disclosure is described in detail. This article uses specific cases for describing the principles and the embodiments of the present disclosure, and the description of the embodiments mentioned above is only for helping to understand the method and the core idea of the present disclosure. Meanwhile, for those skilled in the art, will have various changes in specific embodiments and application scopes according to the idea of the present disclosure. In summary, the content of the specification should not be understood as limit to the present disclosure.

What is claimed is:

1. A display substrate having a transparent electrode, comprising:
   a transparent substrate, wherein a patterned channel is disposed on the transparent substrate;
   the transparent electrode comprising a composite material of MXene material and polyvinylpyrrolidone, wherein the transparent electrode is filled in the patterned channel.

2. The display substrate in claim 1, wherein the transparent substrate is a flexible glass substrate, a perfluoroalkoxy substrate, or a flexible polyimide substrate.

3. The display substrate in claim 1, wherein the MXene material is two-dimension Ti3C2 or two-dimension Ti2C.

4. The display substrate in claim 1, wherein a thickness of the MXene material is 2 mm.

5. The display substrate in claim 1, wherein the transparent electrode has a regular graph, and the regular graph at least partially matches a pattern of the channel.

6. The display substrate in claim 1, wherein the display substrate comprises an insulation protection layer, the insulation protection layer covers part or all of a surface of the transparent electrode.

7. A manufacturing method of a display substrate having a transparent electrode, comprising steps as follows:
   a first step, providing etching liquid, adding a MAX phase material into the etching liquid to obtain a first suspension containing a multi-layer MXene material;
   a second step, adding dimethyl sulfoxide into the first suspension to obtain an one-layer MXene material;
   a third step, adding the one-layer MXene material into a polyvinylpyrrolidone solution to obtain a second suspension;
   a fourth step, adding the second suspension into a patterned channel of the transparent substrate, and by heating and curing to form the transparent electrode.

8. The manufacturing method in claim 7, wherein the first step comprises adding the MAX phase material into the etching liquid to stir, and then performing scrubbing on the MAX phase material after etching.

9. The manufacturing method as claimed in claim 8, wherein a stirring temperature of the etching liquid ranges from 20° C. to 80° C., and a stirring time ranges from 6 hours to 20 hours.

10. The manufacturing method in claim 8, wherein the scrubbing is that the MAX phase material after etching is scrubbed by deoxidized deionized water until a pH value ranges from 6 to 7.

11. The manufacturing method as claimed in claim 7, wherein the transparent substrate is a flexible glass substrate, a perfluoroalkoxy substrate, or a flexible polyimide substrate.

12. The manufacturing method in claim 7, wherein the MAX phase material is a combination of one or several of titanium silicon carbide, titanium aluminum carbide, titanium aluminum nitride, titanium carbonitride, and aluminum titanium carbonitride.

13. The manufacturing method in claim 7, wherein the etching liquid is an aqueous solution of hydrofluoric acid, an aqueous solution of ammonium hydrogen fluoride, or a mixing solution formed by hydrofluoric acid and one or several of hydrochloric acid, sulphuric acid, or villiaumite.

14. The manufacturing method in claim 7, wherein the second step comprises peeling one layer of the multi-layer MXene material and scrubbing the multi-layer MXene material.

15. The manufacturing method in claim 7, wherein the second step comprises performing an ultrasound process and a centrifugal process on the multi-layer MXene material.

16. The manufacturing method in claim 7, wherein the one-layer MXene material is two-dimension Ti3C2 or two-dimension Ti2C.

17. The manufacturing method in claim 7, wherein a thickness of the one-layer MXene material is 2 mm.

18. The manufacturing method in claim 7, wherein the channel in the fourth step is manufactured by a photolithography method or a template occupying method.

19. The manufacturing method in claim 7, wherein the transparent electrode has a regular graph, and the regular graph at least partially matches a pattern of the channel.

* * * * *